(12) United States Patent
Iso et al.

(10) Patent No.: US 9,905,935 B2
(45) Date of Patent: Feb. 27, 2018

(54) ANTENNA DEVICE

(71) Applicant: HITACHI METALS, LTD., Tokyo (JP)

(72) Inventors: Naoki Iso, Hitachi (JP); Masahisa Kaneta, Hitachi (JP); Nobuaki Kitano, Hitachi (JP); Tomoyuki Ogawa, Hitachi (JP); Tsukasa Fujishima, Tokai-mura (JP)

(73) Assignee: HITACHI METALS, LTD., Tokyo (JP)

( * ) Notice: Subject to any disclaimer, the term of this patent is extended or adjusted under 35 U.S.C. 154(b) by 128 days.

(21) Appl. No.: 14/952,612

(22) Filed: Nov. 25, 2015

(65) Prior Publication Data

US 2016/0248167 A1    Aug. 25, 2016

(30) Foreign Application Priority Data

Feb. 24, 2015 (JP) ................................. 2015-034308

(51) Int. Cl.

| | |
|---|---|
| *H01Q 21/08* | (2006.01) |
| *H01Q 21/00* | (2006.01) |
| *H01Q 1/24* | (2006.01) |
| *H01Q 19/10* | (2006.01) |
| *H01P 3/08* | (2006.01) |
| *H05K 1/14* | (2006.01) |

(52) U.S. Cl.
CPC ......... *H01Q 21/0075* (2013.01); *H01P 3/088* (2013.01); *H01Q 1/246* (2013.01); *H01Q 19/10* (2013.01); *H01Q 21/08* (2013.01); *H05K 1/144* (2013.01); *H05K 2201/10409* (2013.01)

(58) Field of Classification Search
CPC .... H01Q 21/0075; H01Q 1/246; H01Q 19/10; H01Q 21/08

USPC .......................................................... 343/893
See application file for complete search history.

(56) References Cited

U.S. PATENT DOCUMENTS

| | | | | |
|---|---|---|---|---|
| 2011/0159832 | A1* | 6/2011 | Yamagajo | ................ H01Q 1/38 455/230 |
| 2014/0055303 | A1* | 2/2014 | Broemer | ................ H01Q 1/243 343/700 MS |
| 2014/0152525 | A1 | 6/2014 | Iso et al. | |

FOREIGN PATENT DOCUMENTS

JP          2014-110557 A      6/2014

* cited by examiner

*Primary Examiner* — Andrea Lindgren Baltzell
(74) *Attorney, Agent, or Firm* — Foley & Lardner LLP

(57) ABSTRACT

An antenna device includes a transmission line for propagating high frequency signal, and a plurality of antenna elements connected to the transmission line. The transmission line includes a first plate-shaped conductor, a second plate-shaped conductor, and a third plate-shaped conductor electrically grounded, a first central conductor disposed between the first and second plate-shaped conductors, a second central conductor disposed between the second and third plate-shaped conductors, an electrically connecting member inserted in an inserting hole formed through the second plate-shaped conductor, to electrically connect the first and second central conductors together, and an electrically grounded conductor disposed adjacent to the electrically connecting member. At least one of the first and second central conductors is provided with a through hole formed adjacent to the electrically connecting member, thereby electrically connects together wiring patterns provided on both surfaces, respectively, of a dielectric substrate of the at least one of the first and second central conductors.

6 Claims, 18 Drawing Sheets

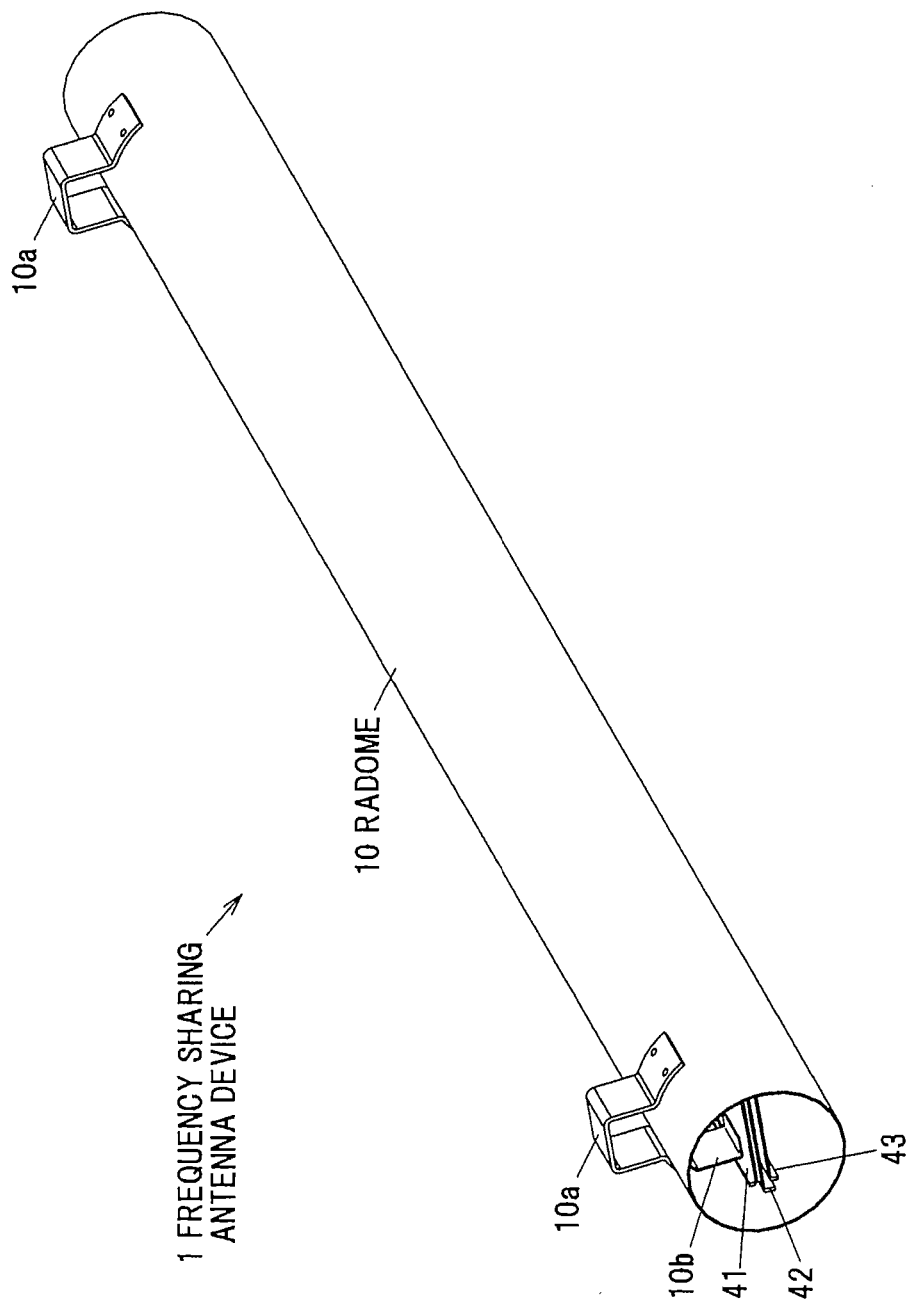

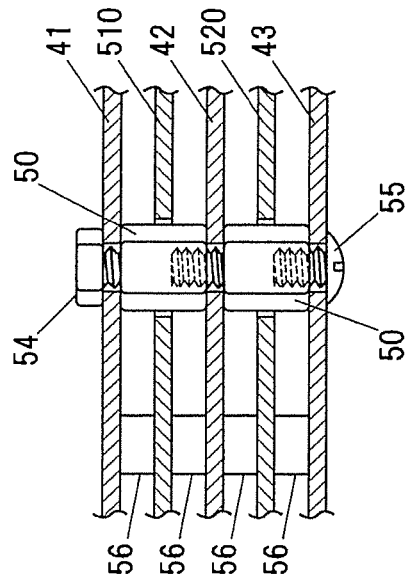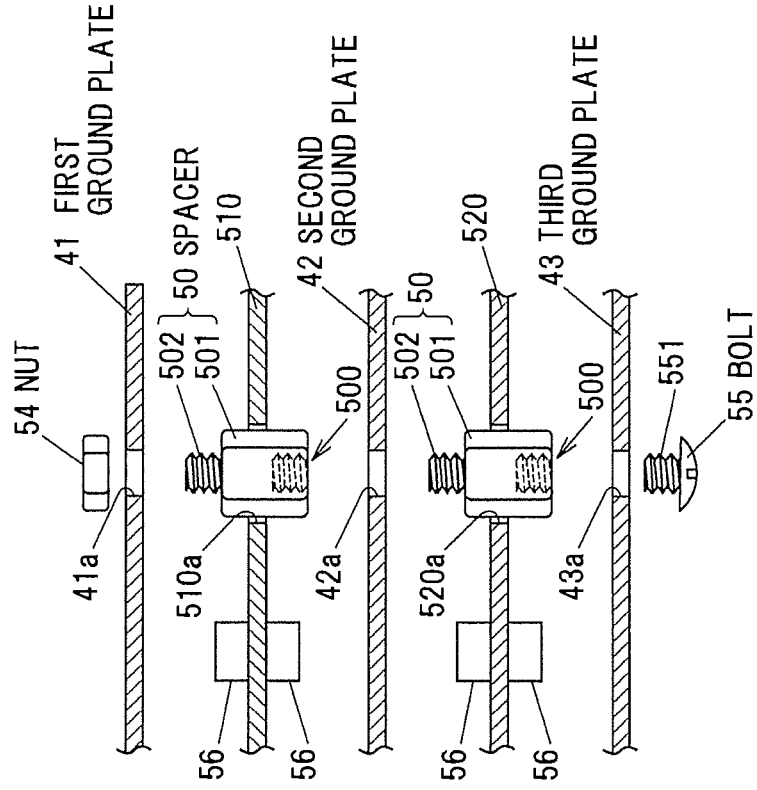
FIG. 8A / FIG. 8B

WITH NO THROUGH HOLE

WITH ONE THROUGH HOLE

WITH TWO THROUGH HOLES
(ds=25mm)

WITH THREE THROUGH HOLES
(ds=25mm)

WITH TWO THROUGH HOLES
(ds=20mm)

WITH TWO THROUGH HOLES
(ds=15mm)

WITH TWO THROUGH HOLES
(ds=20mm FOR FIRST CENTRAL CONDUCTOR
 ds=25mm FOR SECOND CENTRAL CONDUCTOR)

ANTENNA DEVICE

The present application is based on Japanese patent application No. 2015-034308 filed on Feb. 24, 2015, the entire contents of which are incorporated herein by reference.

BACKGROUND OF THE INVENTION

1. Field of the Invention

This invention relates to an antenna device.

2. Description of the Related Art

Conventionally, an antenna device is known that is equipped with a transmission line having a triplate structure composed of one pair of plate-shaped conductors and a central conductor located between the one pair of plate-shaped conductors, and a plurality of antenna elements each capable of transmitting a high frequency signal distributed by that transmission line. (See JP-A-2014-110557 (FIG. 5))

The antenna device disclosed in JP-A-2014-110557 (FIG. 5) includes a plate-shaped first outer conductor, a plate-shaped second outer conductor, which is spaced a predetermined distance apart from the first outer conductor, a linear central conductor, which is disposed between the first outer conductor and the second outer conductor, and a plurality of (eight) antenna elements. The central conductor is branched sequentially from an input side, divided into eight terminals on an output side, and connected to the antenna elements at each terminal. When a high frequency signal is then provided at the input side, a radio wave depending on that high frequency signal is radiated from the plurality of antenna elements.

In this manner, constructing the high frequency signal distributing lines by using the triplate line allows for reducing dielectric loss, and simplifying the line configuration and assembling, in comparison to when using a coaxial cable, for example.

SUMMARY OF THE INVENTION

In recent years, a mobile phone base station antenna, for example, has been required to be compatible with a plurality of frequency bands, and the configuration of the distribution lines has therefore been complicated. Further, constructing the complicatedly configured distribution lines of the antenna device by using the triplate line with the central conductor located between the one pair of outer conductors as described above has increased the area of the outer conductors, and has been likely to increase the size of the antenna device.

Accordingly, the present inventors have considered forming the triplate line into a plurality of layers. However, forming the triplate line into a plurality of layers, and connecting between the respective central conductors of the triplate lines by a connecting member has increased the transmission loss of the high frequency signal at a connecting portion between the central conductors including that connecting member.

For this, the present inventors have suggested an antenna device in which is arranged an electrically grounded metallic spacer adjacent to the connecting member for connection between the central conductors. This configuration has made it possible to reduce the transmission loss at the connecting portion for connection between the central conductors.

However, that antenna device has had the following problem.

Namely, there has been the problem that, in that antenna device, an S-parameter $S_{21}$, which describes a pass property, rapidly lowers in a particular frequency band, causing a large transmission loss in that frequency band.

Accordingly, it is an object of the present invention to provide an antenna device, which ensures a further improvement in transmission loss.

According to an embodiment of the invention, an antenna device comprises:

a transmission line for propagating high frequency signal; and a plurality of antenna elements connected to the transmission line, wherein the transmission line includes:

a first plate-shaped conductor, a second plate-shaped conductor, and a third plate-shaped conductor electrically grounded, the second plate-shaped conductor including an inserting hole formed therethrough;

a first central conductor disposed between the first plate-shaped conductor and the second plate-shaped conductor;

a second central conductor disposed between the second plate-shaped conductor and the third plate-shaped conductor;

an electrically connecting member inserted in the inserting hole formed through the second plate-shaped conductor, and configured to electrically connect the first central conductor and the second central conductor together; and an electrically grounded conductor disposed adjacent to the electrically connecting member, wherein the first central conductor and the second central conductor each includes a substrate made of a dielectric, and are each composed of respective wiring patterns provided on both surfaces, respectively, of the respective substrate, wherein at least one of the first central conductor and the second central conductor is provided with a first through hole formed adjacent to the electrically connecting member, thereby electrically connects together the wiring patterns on both the surfaces of the substrate of the at least one of the first central conductor and the second central conductor.

In the embodiment, the following modifications and changes may be made.

(i) The first through hole is provided for both the first central conductor and the second central conductor.

(ii) The at least one of the first central conductor and the second central conductor is provided with one or more second through holes located on an opposite side of the first through hole to the electrically connecting member and spaced apart from the first through hole, thereby electrically connects together the wiring patterns on both the surfaces of the substrate of the at least one of the first central conductor and the second central conductor.

(iii) The first through hole and the second through holes are provided at an equal through hole pitch of not longer than 25 mm in a longitudinal direction of the wiring patterns.

(iv) The third plate-shaped conductor includes openings formed therethrough, so that the antenna elements are inserted in those openings respectively formed through the third plate-shaped conductor and are electrically connected to the second central conductor, wherein the grounded conductor is disposed adjacent to connecting portions for the antenna elements and the second central conductor, wherein the second central conductor is provided with a third through hole adjacent to the connecting portions for the antenna elements and the second central conductor, thereby electrically connects together the wiring patterns on both the surfaces of the substrate of the second central conductor.

(v) The first plate-shaped conductor includes an opening formed therethrough, and is provided with a feeding cable to be inserted in that opening formed through the first plate-shaped conductor and be electrically connected to the first central conductor, wherein the grounded conductor is disposed adjacent to a connecting portion for the feeding cable and the first central conductor, wherein the first central conductor is provided with a fourth through hole adjacent to the connecting portion for the feeding cable and the first central conductor, thereby electrically connects together the wiring patterns on both the surfaces of the substrate of the first central conductor.

Points of the Invention

The antenna device of the present invention allows for a further improvement in transmission loss.

BRIEF DESCRIPTION OF THE DRAWINGS

The preferred embodiments according to the invention will be explained below referring to the drawings, wherein:

FIG. 2 is a perspective view showing an appearance of a frequency sharing antenna device;

FIG. 8A is an explanatory diagram showing a fixing structure for first, second, and third ground plates and a supporting structure for first and second substrates;

FIG. 8B is an explanatory diagram showing the fixing structure for the first, second, and third ground plates and the supporting structure for the first and second substrates;

DETAILED DESCRIPTION OF THE PREFERRED EMBODIMENTS

Embodiment

Below will be described a frequency sharing antenna device as one embodiment of an antenna device according to the present invention, with reference to the drawings. This frequency sharing antenna device is used as a base station antenna for a mobile phone. Note that, although in the following description, the frequency sharing antenna device will be described for use in transmitting a high frequency signal, this frequency sharing antenna device may be used for receiving thereof as well.

(Function Configuration of the Frequency Sharing Antenna Device)

FIGS. 1A to 1D are schematic diagrams showing function configurations, respectively, of the frequency sharing antenna device in this embodiment. The frequency sharing antenna device is capable of transmitting horizontally polarized and vertically polarized high frequency signals in a band of 1.5 to 2 GHz, and horizontally polarized and vertically polarized high frequency signals in a band of 700 to 800 MHz. Herein, the 1.5 to 2 GHz band is referred to as the first frequency band, and the 700 to 800 MHz band is referred to as the second frequency band.

Figure 1A:
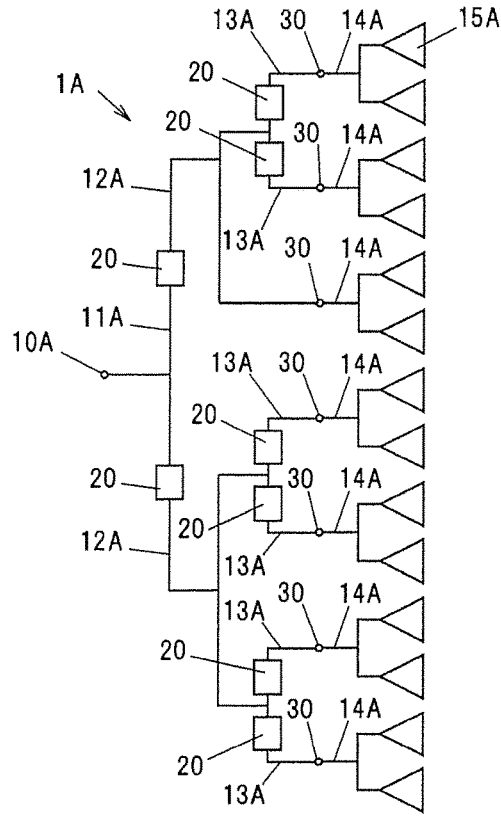
FIG. 1A is a schematic configuration diagram showing a configuration example of a first transmitting portion.

FIG. 1A is a schematic configuration diagram showing a configuration example of a first transmitting portion 1A capable of transmitting a horizontally polarized wave in the first frequency band. This first transmitting portion 1A is configured in such a manner as to distribute a signal input to a terminal 10A, which is connected to a coaxial cable core not shown, to a plurality (e.g. fourteen in the present embodiment) of first horizontally polarized antenna elements 15A.

Specifically, the first transmitting portion 1A includes a first distribution line 11A to distribute a signal input to the terminal 10A, second distribution lines 12A to further distribute the signals, respectively, distributed by the first distribution line 11A, third distribution lines 13A to further distribute the signals, respectively, distributed by the second distribution lines 12A, and fourth distribution lines 14A to further distribute the signals, respectively, distributed by the third distribution lines 13A. The fourth distribution lines 14A are then connected to the first horizontally polarized antenna elements 15A at terminals thereof, respectively.

In addition, between the first distribution line 11A and each of the second distribution lines 12A and between each of the second distribution lines 12A and each of the third distribution lines 13A, there are provided phase shifters 20, respectively. Those phase shifters 20 allow for signal phase variations to thereby adjust directivity of radio waves to be radiated from the plurality of first horizontally polarized antenna elements 15A.

Furthermore, the second distribution lines 12A or the third distribution lines 13A and the fourth distribution lines 14A are connected by connecting pins 30, respectively, acting as an electrically connecting member to be described later.

Figure 1B:
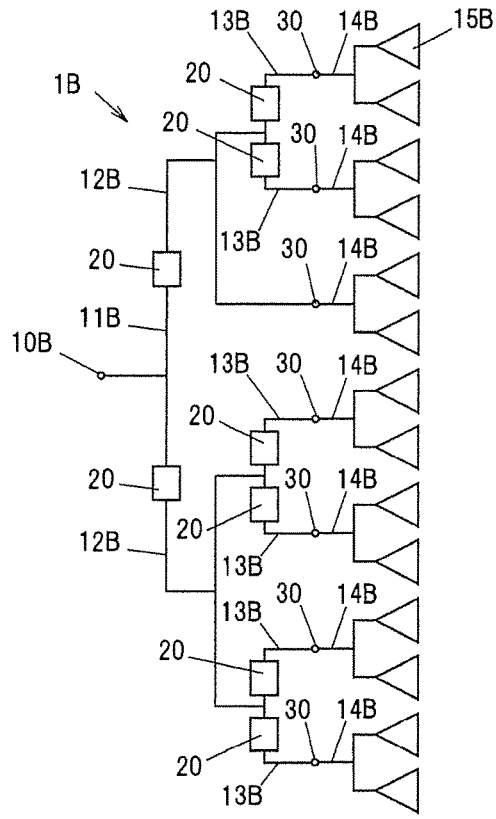
FIG. 1B is a schematic configuration diagram showing a configuration example of a second transmitting portion.

FIG. 1B is a schematic configuration diagram showing a configuration example of a second transmitting portion 1B capable of transmitting a vertically polarized wave in the first frequency band. The second transmitting portion 1B is configured in the same manner as the first transmitting portion 1A. That is, the second transmitting portion 1B is configured in such a manner as to distribute a signal input to a terminal 10B, which is connected to a coaxial cable core not shown, to a plurality (e.g. fourteen in the present embodiment) of first vertically polarized antenna elements 15B.

Specifically, the second transmitting portion 1B includes a first distribution line 11B to distribute a signal input to the terminal 10B, second distribution lines 12B to further distribute the signals, respectively, distributed by the first distribution line 11B, third distribution lines 13B to further distribute the signals, respectively, distributed by the second distribution lines 12B, and fourth distribution lines 14B to further distribute the signals, respectively, distributed by the third distribution lines 13B. The fourth distribution lines 14B are then connected to the first vertically polarized antenna elements 15B at terminals thereof, respectively.

Between the first distribution line 11B and each of the second distribution lines 12B and between each of the second distribution lines 12B and each of the third distribution lines 13B, there are provided phase shifters 20, respectively. In addition, the second distribution lines 12B or the third distribution lines 13B and the fourth distribution lines 14B are connected by connecting pins 30, respectively.

Figure 1C:
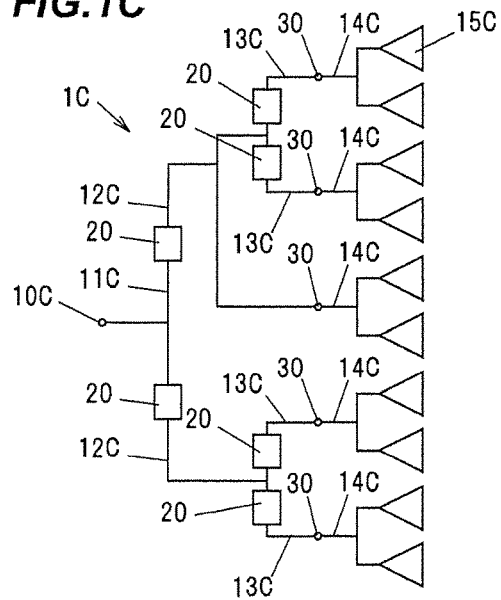
FIG. 1C is a schematic configuration diagram showing a configuration example of a third transmitting portion.

FIG. 1C is a schematic configuration diagram showing a configuration example of a third transmitting portion 1C capable of transmitting a horizontally polarized wave in the second frequency band. The third transmitting portion 1C is configured in such a manner as to distribute a signal input to a terminal 10C, which is connected to a coaxial cable core not shown, to a plurality (e.g. ten in the present embodiment) of second horizontally polarized antenna elements 15C.

Specifically, the third transmitting portion 1C includes a first distribution line 11C to distribute a signal input to the terminal 10C, second distribution lines 12C to further distribute the signals, respectively, distributed by the first distribution line 11C, third distribution lines 13C to further distribute the signals, respectively, distributed by the second distribution lines 12C, and fourth distribution lines 14C to further distribute the signals, respectively, distributed by the third distribution lines 13C. The fourth distribution lines 14C are then connected to the second horizontally polarized antenna elements 15C at terminals thereof, respectively.

Between the first distribution line 11C and each of the second distribution lines 12C, and between each of the second distribution lines 12C and each of the third distribution lines 13C, there are provided phase shifters 20, respectively. In addition, the second distribution lines 12C or the third distribution lines 13C and the fourth distribution lines 14C are connected by connecting pins 30, respectively.

Figure 1D:
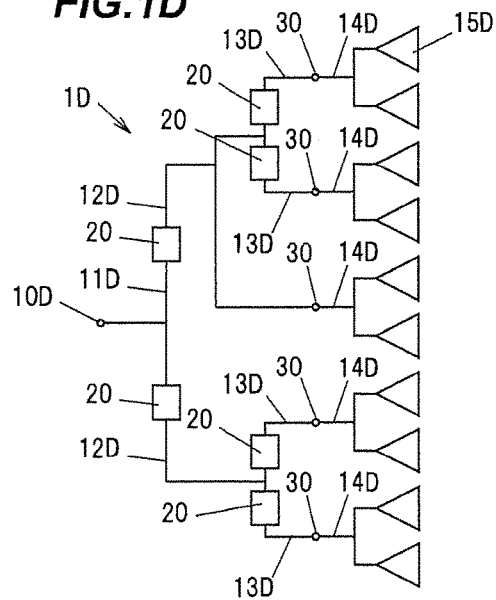
FIG. 1D is a schematic configuration diagram showing a configuration example of a fourth transmitting portion.

FIG. 1D is a schematic configuration diagram showing a configuration example of a fourth transmitting portion 1D capable of transmitting a vertically polarized wave in the second frequency band. The fourth transmitting portion 1D is configured in the same manner as the third transmitting portion 1C. That is, the fourth transmitting portion 1D is configured in such a manner as to distribute a signal input to a terminal 10D, which is connected to a coaxial cable core not shown, to a plurality (e.g. ten in the present embodiment) of second vertically polarized antenna elements 15D.

Specifically, the third transmitting portion 1D includes a first distribution line 11D to distribute a signal input to the terminal 10D, second distribution lines 12D to further distribute the signals, respectively, distributed by the first distribution line HD, third distribution lines 13D to further distribute the signals, respectively, distributed by the second distribution lines 12D, and fourth distribution lines 14D to further distribute the signals, respectively, distributed by the third distribution lines 13D. The fourth distribution lines 14D are then connected to the second vertically polarized antenna elements 15D at terminals thereof, respectively.

Between the first distribution line 11D and each of the second distribution lines 12D and between each of the second distribution lines 12D and each of the third distribution lines 13D, there are provided phase shifters 20, respectively. In addition, the second distribution lines 12D or the third distribution lines 13D and the fourth distribution lines 14D are connected by connecting pins 30, respectively.

Herein, the first horizontally polarized antenna elements 15A, the first vertically polarized antenna elements 15B, the second horizontally polarized antenna elements 15C, and the second vertically polarized antenna elements 15D are referred to collectively as antenna elements 15.

(Configuration of the Frequency Sharing Antenna Device)

Figure 3:
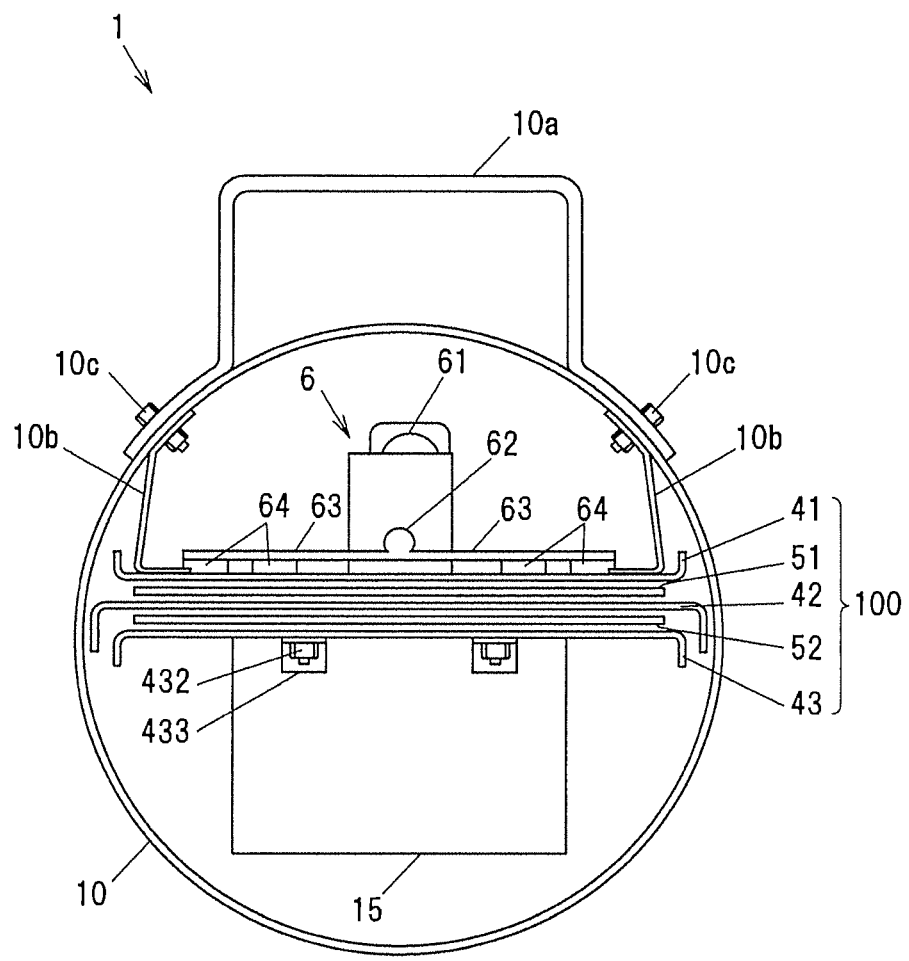
FIG. 3 is a configuration diagram showing an internal configuration of a radome for the frequency sharing antenna device.

FIG. 2 is a perspective view showing an appearance of a frequency sharing antenna device 1. FIG. 3 is a configuration diagram showing an internal configuration of a radome 10 of the frequency sharing antenna device 1.

The frequency sharing antenna device 1 includes a transmission line 100 for a high frequency signal to be propagated therein, the plurality of antenna elements 15 capable of transmitting the high frequency signals distributed by the transmission line 100, a moving mechanism 6 to move dielectric plates 20 (to be described later), which are configured as the phase shifters 20, and a radome 10 made of an insulative resin such as FRP (fiber reinforced plastics) or the like.

The radome 10 has a circular cylindrical shape, and is closed by an antenna cap (not shown) at both ends thereof, and is mounted on an antenna tower, etc. with a pair of mounting brackets 10a in such a manner that its longitudinal direction is a vertical direction. The transmission line 100, the plurality of antenna elements 15 and the moving mechanism 6 are disposed within the radome 10.

The transmission line 100 has a triplate structure composed of a plurality of plate-shaped conductors, and central conductors each located between adjacent plate-shaped conductors, respectively, of the plurality of plate-shaped conductors. In this embodiment, the transmission line 100 includes first, second, and third ground plates 41, 42, and 43, which are configured as the plurality of plate-shaped conductors to be electrically grounded, a first central conductor 51, which is disposed between adjacent first and second ground plates 41 and 42 of the first, second, and third ground plates 41, 42, and 43, and a second central conductor 52, which is disposed between adjacent second and third ground plates 42 and 43 of the first, second, and third ground plates 41, 42, and 43.

The first, second, and third ground plates 41, 42, and 43 are arranged parallel to each other, and the second ground plate 42 is located between the first ground plate 41 and the third ground plate 43. In addition, the first, second, and third ground plates 41, 42, and 43 are in an elongated plate shape whose longitudinal direction is a central axis direction of the radome 10. Note that, in FIG. 3, there are shown no such members as spacers, etc. to be described later, which are disposed between the first, second, and third ground plates 41, 42, and 43, and between the first to third ground plates 41 to 43 and the first and second central conductors 51 and 52. The length in the central axis direction of the radome 10 is, for example, 1 to 2.7 m.

Fixing brackets 10b to fix the first ground plate 41 to the radome 10 are fixed to both longitudinal ends, respectively, of the first ground plate 41. The fixing brackets 10b are configured to clamp the radome 10 between them and the mounting brackets 10a, and are fastened to the radome 10 by bolts 10c.

Figure 4:
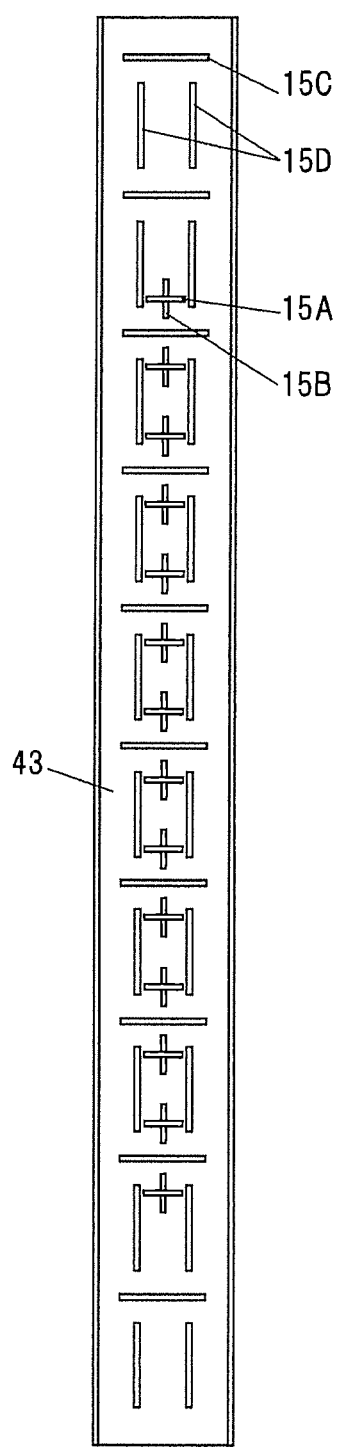
FIG. 4 is an overall view showing a plurality of antenna elements arranged on a third ground plate.
Figure 5:
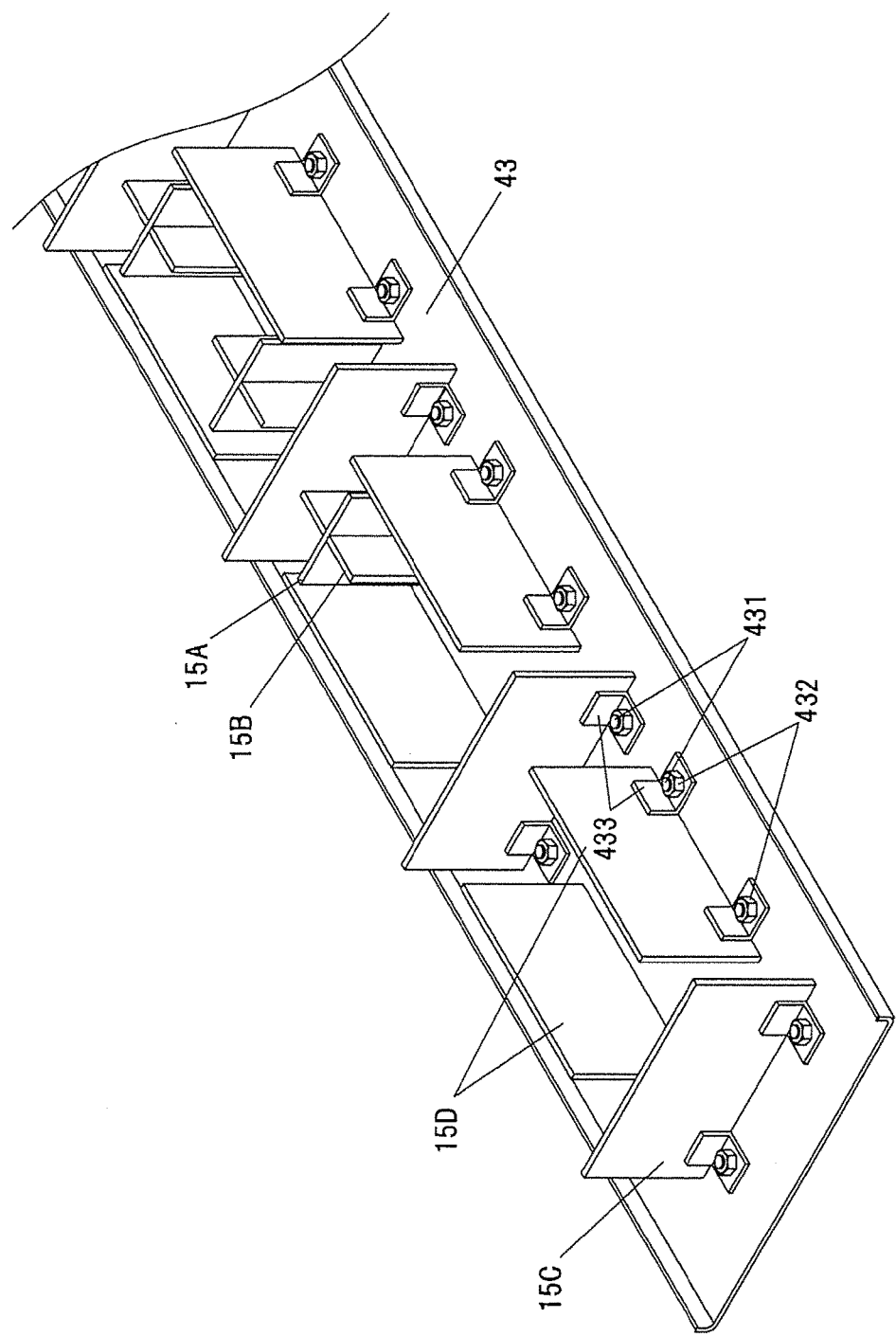
FIG. 5 is a partial perspective view showing the plurality of antenna elements arranged on the third ground plate.

FIGS. 4 and 5 are an overall view and a partial perspective view, respectively, showing the plurality of antenna elements 15 disposed on the third ground plate 43. Incidentally, the third ground plate 43, when the frequency sharing antenna device 1 is used, is installed in such a manner that the upper side of FIG. 4 is the upper side in the vertical direction.

The plurality of antenna elements 15 are a printed dipole antenna, which serves as a radiating element, and which is made of a printed circuit board formed with a wiring pattern not shown on a plate-shaped dielectric. Of the plurality of antenna elements 15, the first horizontally polarized antenna elements 15A and the first vertically polarized antenna elements 15B are arranged in pairs, respectively, in such a manner that the paired first horizontally and vertically polarized antenna elements 15A and 15B cross each other, respectively, in the shape of a cross. The second horizontally polarized antenna elements 15C are disposed with their substrate surfaces lying in the horizontal direction. The second vertically polarized antenna elements 15D are configured as pairs of printed circuit boards facing each other, respectively, in the horizontal direction.

The plurality of antenna elements 15 are fixed to the third ground plate 43 perpendicular to the third ground plate 43 by L-shaped mounting brackets 433 fixed to the third ground plate 43 by bolts 431 and nuts 432.

Further, the plurality of antenna elements 15 are provided with unillustrated protruding portions respectively being inserted in openings respectively which are formed through the third ground plate 43, so that respective wiring patterns of the plurality of antenna elements 15 to act as radiating elements are connected to the second central conductor 52 via those protruding portions respectively.

Figure 6:
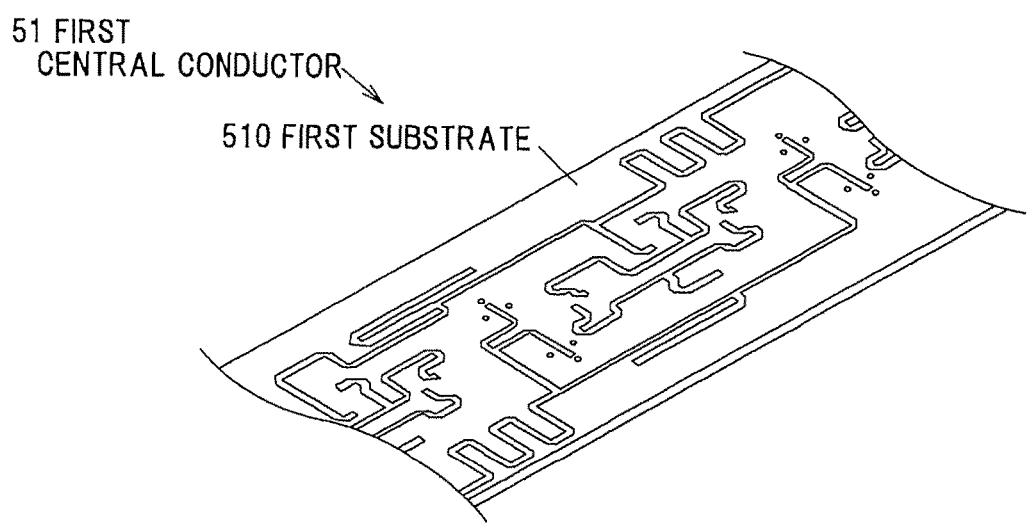
FIG. 6 is a perspective view showing a portion of a first central conductor.

FIG. 6 is a perspective view showing a portion of the first central conductor 51. The first central conductor 51 is formed of a metal foil of copper or the like provided as a wiring pattern on a surface of the flat plate shaped first substrate 510 made of a dielectric. The respective first distribution lines 11A, 11B, 11C, 11D, the respective second distribution lines 12A, 12B, 12C, 12D, the respective third distribution lines 13A, 13B, 13C, and 13D of the first, second, third and fourth transmitting portions 1A, 1B, 1C, and 1D (FIG. 1) are configured as the first central conductor 51.

Figure 7:
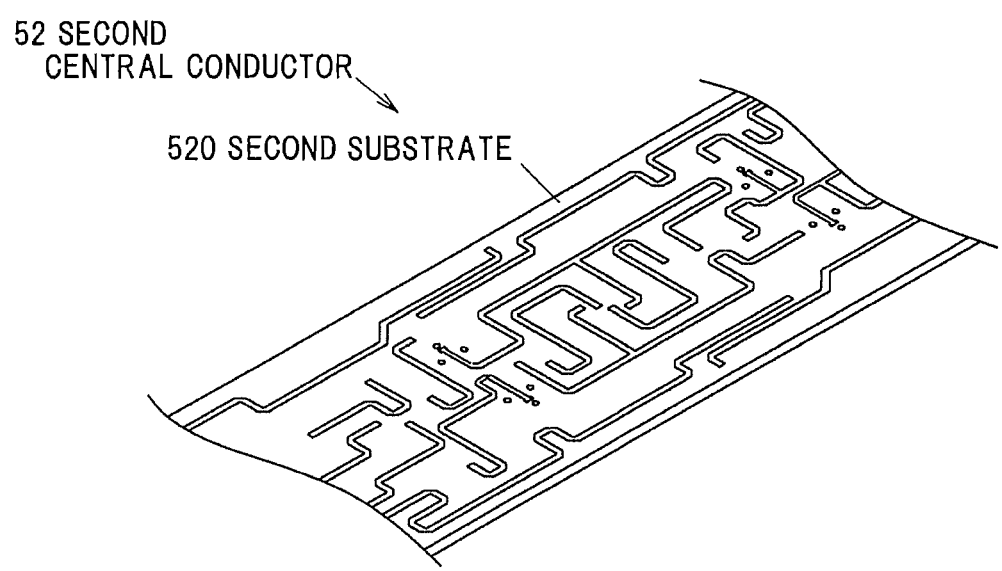
FIG. 7 is a perspective view showing a portion of a second central conductor.

FIG. 7 is a perspective view showing a portion of the second central conductor 52. As with the first central conductor 51, the second central conductor 52 is formed of a metal foil of copper or the like provided as a wiring pattern on a surface of the flat plate shaped second substrate 520 made of a dielectric. The respective first, second, third, and fourth distribution lines 14A, 14B, 14C, and 14D of the first, second, third and fourth transmitting portions 1A, 1B, 1C, and 1D are configured as the second central conductor 52. The first substrate 510 and the second substrate 520 are made of, for example, an electrically insulative resin such as glass epoxy or the like, and have a thickness of 0.8 mm, for example.

The wiring pattern to be configured as the first central conductor 51 is provided on both the surfaces of the first substrate 510. Similarly, the wiring pattern to be configured as the second central conductor 52 is provided on both the surfaces of the second substrate 520.

(Supporting Structure for the First Substrate and the Second Substrate)

FIGS. 8A and 8B are explanatory diagrams showing a fixing structure for the first, second, and third ground plates 41, 42, and 43 of the transmission line 100 and a supporting structure for the first and second substrates 510 and 520. FIG. 8A shows the transmission line 100 before assembling, and FIG. 8B shows the transmission line 100 after assembling.

Between the first ground plate 41 and the second ground plate 42, and between the second ground plate 42 and the third ground plate 43, there are arranged metallic spacers 50 respectively made of an electrical conductor. The metallic spacer 50 to be disposed between the first ground plate 41 and the second ground plate 42 is inserted in an inserting hole 510a, which is formed through the first substrate 510. The metallic spacer 50 to be disposed between the second ground plate 42 and the third ground plate 43 is inserted in an inserting hole 520a, which is formed through the second substrate 520.

The metallic spacers 50 are electrically conductive, and are made of a copper-plated or tin-plated brass, for example. Also, the metallic spacers 50 integrally include a shaft 501 and a externally threaded portion 502, and the respective shaft 501 is formed with a threaded hole 500 thereon. In FIGS. 8A and 8B, those threaded holes 500 are indicated by a broken line. In the present embodiment, the shafts 501 of the metallic spacers 50 are in a hexagonal prism shape, but may be in a circular cylindrical shape.

Between the first ground plate 41 and the second ground plate 42, and between the second ground plate 42 and the third ground plate 43, there are interposed the shafts 501 of the metallic spacers 50 respectively, in such a manner that the first ground plate 41 and the second ground plate 42, and the second ground plate 42 and the third ground plate 43 are spaced apart, depending on a length of the shafts 501. The length of the shafts 501 is 5.0 mm, for example. The first, second, and third ground plates 41, 42, and 43 are electrically connected to each other by the metallic spacers 50 therebetween.

The externally threaded portion 502 of the metallic spacer 50 disposed between the first ground plate 41 and the second ground plate 42 is screwed into a nut 54. The threaded hole 500 of the metallic spacer 50 disposed between the first ground plate 41 and the second ground plate 42 is screwed onto the externally threaded portion 502 of the metallic spacer 50 disposed between the second ground plate 42 and the third ground plate 43. Also, the threaded hole 500 of the metallic spacer 50 disposed between the second ground plate 42 and the third ground plate 43 is screwed onto an externally threaded portion 551 of a bolt 55.

The first, second, and third ground plates 41, 42, and 43 are formed with inserting holes 41a, 42a, and 43a therethrough, respectively, for the externally threaded portions 502 of the metallic spacers 50 and the externally threaded portion 551 of the bolt 55 to be inserted therein respectively.

In this manner, the transmission line 100 is configured with the two metallic spacers 50, the one nut 54, and the one bolt 55 fixed to each other, thereby allowing the first, second, and third ground plates 41, 42, and 43 to be arranged parallel to each other at each predetermined pitch. Note that the fixing structure composed of the two metallic spacers 50, the one nut 54, and the one bolt 55 is provided at a plurality of locations in the transmission line 100, and that the pitch between the first, second, and third ground plates 41, 42, and 43, and the pitch between the first and second substrates 510 and 520 are held constant.

The first substrate 510 is supported between the first ground plate 41 and the second ground plate 42 by resin spacers 56. The second substrate 520 is supported between the second ground plate 42 and the third ground plate 43 by resin spacers 56. The resin spacers 56 to support the first substrate 510 are fixed by, for example, bonding to both the surfaces, respectively, of the first substrate 510. Similarly, the resin spacers 56 to support the second substrate 520 are fixed by, for example, bonding to both the surfaces, respectively, of the second substrate 520. The thickness of each of the resin spacers 56 is 2.1 mm, for example.

(Connecting Structure Between the First Central Conductor and the Second Central Conductor)

Figure 9:
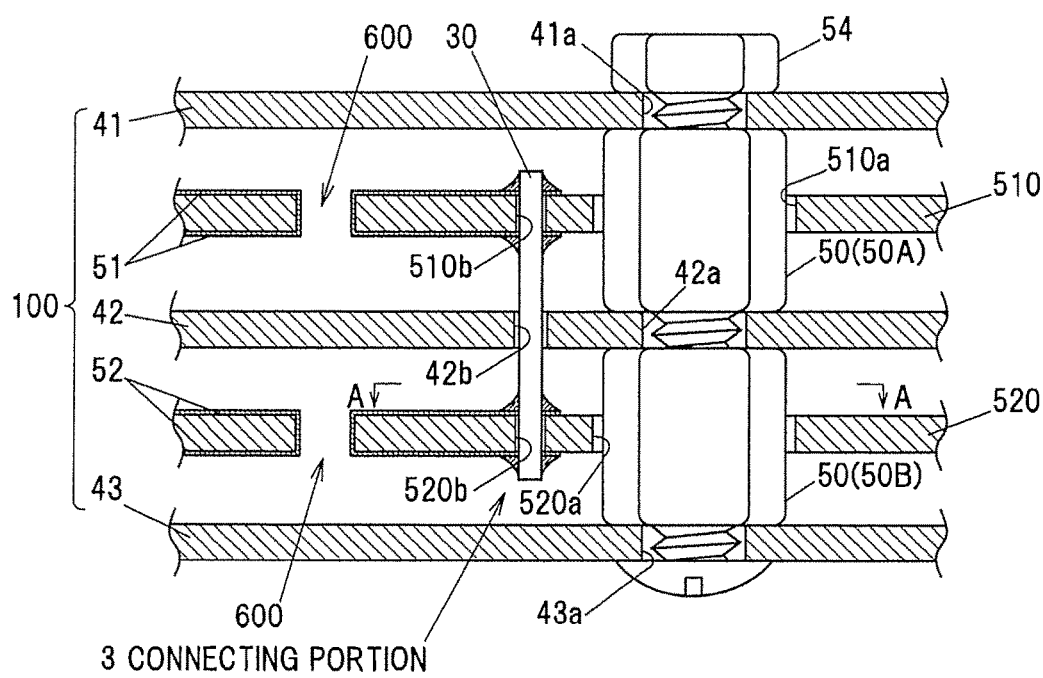
FIG. 9 is a schematic view showing a connecting structure between the first central conductor and the second central conductor.
Figure 10:
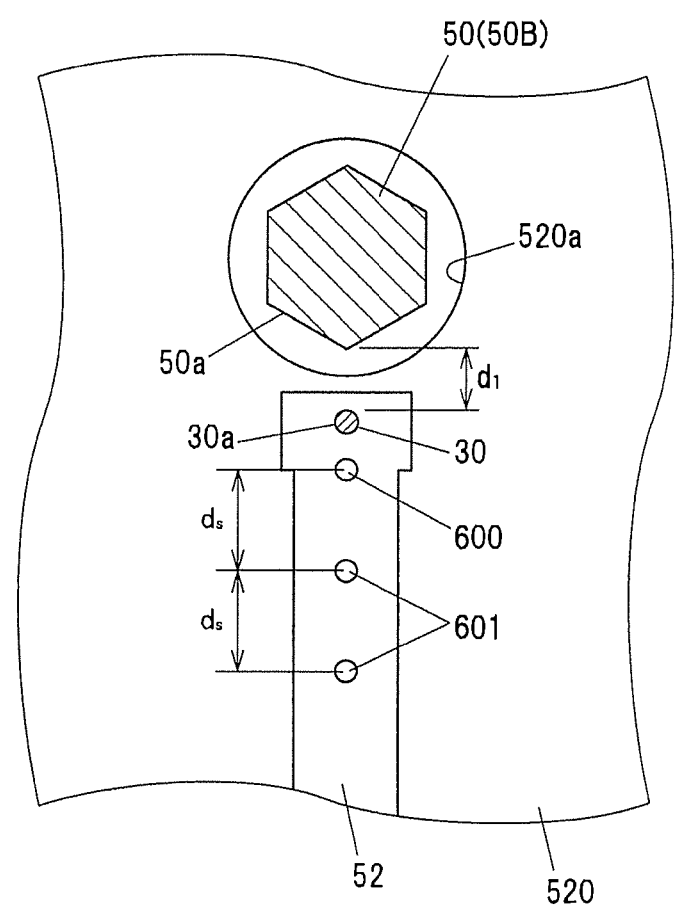
FIG. 10 is a cross sectional view taken along A-A line in FIG. 9.

FIG. 9 is a schematic diagram showing a connecting structure between the first central conductor 51 and the second central conductor 52. FIG. 10 is a cross sectional view taken along an A-A line in FIG. 9.

The central conductors (the first central conductor 51 and the second central conductor 52) arranged with the second ground plate 42 therebetween are electrically connected together by a connecting pin 30 for a connecting portion 3 as shown in FIG. 9, which is configured as an electrically connecting member inserted in a connecting pin through hole 42b, which is formed through the second ground plate 42.

The connecting pin 30 is, for example, a shaft-shaped member made of a highly conductive metal such as copper, brass or the like. In this embodiment, although the connecting pin 30 has a circular cylindrical shape, the shape of the connecting pin 30 is not limited thereto, but may be a quadrangular prism shape or a hexagonal prism shape, for example. The connecting pin 30 is inserted, at both its ends, in an inserting hole 510b, which is formed through the first substrate 510, and an inserting hole 520b, which is formed through the second substrate 520, respectively, and the connecting pin 30 is then soldered to the first central conductor 51 and the second central conductor 52. In addition, the connecting pin 30 is arranged with its central axis being perpendicular to the first substrate 510, the second substrate 520, and the second ground plate 42.

This connecting structure using the connecting pin 30 results in connections between the third distribution lines 13A and the fourth distribution lines 14A, respectively, of the first transmitting portion 1A, connections between the third distribution lines 13B and the fourth distribution lines 14B, respectively, of the second transmitting portion 1B, connections between the third distribution lines 13C and the fourth distribution lines 14C, respectively, of the third transmitting portion 1C, and connections between the third distribution lines 13D and the fourth distribution lines 14D, respectively, of the fourth transmitting portion 1D.

Adjacent to the connecting pin 30, there are arranged the metallic spacer 50 disposed between the first ground plate 41 and the second ground plate 42, and the metallic spacer 50 disposed between the second ground plate 42 and the third ground plate 43. In the following description, the metallic spacer 50 disposed between the first ground plate 41 and the second ground plate 42 is referred to as "the metallic spacer 50A," and the metallic spacer 50 disposed between the second ground plate 42 and the third ground plate 43 is referred to as "the metallic spacer 50B." The metallic spacer 50A and the metallic spacer 50B are one aspect of an electrically grounded conductor according to the present invention.

The metallic spacer 50A and the metallic spacer 50B are coupled together in the inserting hole 42a through the second ground plate 42 therebetween. Specifically, the externally threaded portion 502 of the metallic spacer 50B is screwed into the threaded hole 500 of the metallic spacer 50A. This allows the second ground plate 42 to be clamped between the respective shafts 501 of the metallic spacer 50A and the metallic spacer 50B.

As shown in FIG. 10, when $d_1$ is the distance between the connecting pin 30 and the metallic spacer 50B in a direction parallel to the second ground plate 42, the distance $d_1$ is not longer than 2.5 mm. Note that the distance $d_1$ refers to a shortest distance between an outer peripheral surface 30a of the connecting pin 30 and an outer peripheral surface 50a of the metallic spacer 50B, in the direction parallel to the second ground plate 42.

Also, when the metallic spacer 50B has a polygonal cross sectional shape as in this embodiment, it is desirable to set the location of the inserting hole 42a through the second ground plate 42, etc. in such a manner that the distance $d_1$ between the metallic spacer 50B and the connecting pin 30 is not longer than 2.5 mm, even when the metallic spacer 50B is fixed at any angle (phase) in a circumferential direction around its central axis. In other words, in this embodiment, the metallic spacer 50B is fixed at such a location that the distance $d_1$ between it and the connecting pin 30 is not longer than 2.5 mm, even when the metallic spacer 50B is fixed at any angle in a circumferential direction around its central axis. Note that although not shown, the metallic spacer 50A is fixed in such a manner that the distance between the metallic spacer 50A and the connecting pin 30 is also not longer than 2.5 mm in the same manner as described above.

Figure 11:
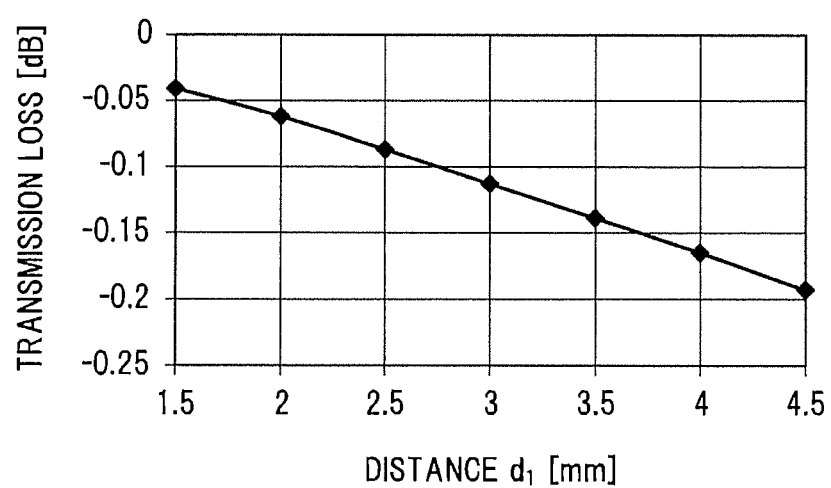
FIG. 11 is a graph showing a relationship between distance between a connecting pin and a metallic spacer, and transmission loss.

FIG. 11 is a graph showing a relationship between the distance $d_1$ between the connecting pin 30 and the metallic spacers 50A and 50B, and the transmission loss (i.e. the S-parameter $S_{21}$ describing a pass property) in the connecting portion 3 for the first central conductor 51 and the second central conductor 52 when a 2 GHz high frequency signal is transmitted from the first central conductor 51 to the second central conductor 52 via the connecting pin 30.

As seen from this graph, when the distance $d_1$ between the connecting pin 30 and the metallic spacers 50A and 50B is set at not longer than 2.5 mm, it is possible to reduce the transmission loss below 0.1 dB. That is, when the distance $d_1$ is not longer than 2.5 mm, it is possible to achieve good transmission properties in the connecting portion 3. Incidentally, one reason for the transmission loss to be reduced by arranging the metallic spacers 50A and 50B adjacent to the connecting pin 30 is considered to be because of a decrease in path length difference between a current path for current to flow in the connecting pin 30, and a current path for current to flow in the plurality of metallic spacers 50.

Incidentally, it is desirable to ensure the distance $d_1$ of not shorter than 1.0 mm, in order to prevent shorting between the first central conductor 51 or the second central conductor 52 and the metallic spacers 50A and 50B, or due to constraints on machining of the first substrate 510 and the second substrate 520.

Referring back to FIGS. 9 and 10, in this embodiment, one or both of the first central conductor 51 and the second central conductor 52 are provided with a first through hole 600, which is formed adjacent to the connecting pin 30 thereby electrically connects together the wiring patterns on both the surfaces of one or both of the substrates 510 and 520, respectively. Those first through holes 600 are formed through the central conductors 51 and 52 at locations opposite the metallic spacers 50, respectively, with the connecting pin 30 between those first through holes 600 and the metallic spacers 50.

When the wiring patterns formed on both the surfaces of the substrates 510 and 520 are used as the central conductors 51 and 52, it is considered that when the central conductors 51 and 52 are connected together with the connecting pin 30 therebetween, path length differences between current paths in the wiring patterns on the respective front and back surfaces of the substrates 510 and 520 arise, causing a rapid lowering in the S-parameter $S_{21}$ describing the pass property in a particular frequency band, in other words, an increase in the transmission loss in a particular frequency band.

In this embodiment, the wiring patterns on the respective front and back surfaces of the substrates 510 and 520 are electrically connected together by the first through holes 600, to thereby reduce the influence of the path length differences between the current paths in the wiring patterns on those front and back surfaces, and ensure improvement in the transmission loss.

Note that, as described above, although reducing the distance $d_1$ between the connecting pin 30 and the metallic spacers 50A and 50B allows for a decrease in the transmission loss, shortening the distance $d_1$ between the connecting pin 30 and the metallic spacers 50A and 50B is limited by prevention of short circuiting or constraints on machining. Providing the first through holes 600 as in this embodiment makes it possible to effectively decrease the transmission loss, even when setting the distance $d_1$ somewhat long.

Because the influence of the path length differences between the current paths on the transmission loss is large adjacent to the connecting pin 30, it is desirable to provide the first through holes 600 in such a manner as to be located as adjacent to the connecting pin 30 as possible. Specifically, it is desirable to set the distance between the connecting pin 30 and the first through holes 600 within at least 10 mm.

Moreover, providing the first through holes 600 for both the first central conductor 51 and the second central conductor 52 allows for a further reduction in the influence of the path length differences between the current paths, making it possible to expect a further improvement in transmission properties. Thus, it is desirable to provide the first through holes 600 for both the central conductors 51 and 52. Note that the locations for providing the first through holes 600 through the two central conductors 51 and 52 are not limited to locations opposite each other (i.e. locations overlapping each other in plan view).

In this embodiment, furthermore, one or more second through holes 601 are provided on the opposite side of the first through holes 600 to the connecting pin 30 in such a manner as to be spaced apart from the first through holes 600, thereby electrically connects together the wiring patterns on both the surfaces of the substrates 510 and 520. Providing the one or more second through holes 601, i.e. providing a total of two or more through holes 600 and 601 allows for a further reduction in the transmission loss. A reason therefor will be described later.

The respective first and second through holes 600 and 601 of the central conductors 51 and 52 are provided at an equal pitch in the longitudinal direction of the wiring patterns. Herein, the pitch of the through holes 600 and 601 is referred to as the through hole pitch ds. It is desirable to set the through hole pitch ds at not longer than 25 mm. A reason therefor will also be described later.

Although in this embodiment the through holes 600 and 601 are in a circular shape having a diameter of 1 mm, the diameter and shape of the through holes 600 and 601 are not particularly limited thereto. Further, although in this embodiment, the through holes 600 and 601 are formed in such a manner as to be aligned in a line through the middle in a width direction of the wiring patterns, the through holes 600 and 601 may be formed in such a manner as to be located off the middle in the width direction of the wiring patterns.

Although in the present embodiment, the through holes 600 and 601 are configured in such a manner as to be formed with an electrically conductive layer around inner peripheral surfaces of the through holes 600 and 601 formed through the wiring patterns thereby electrically connects together the wiring patterns on the respective front and back surfaces of the substrates 510 and 520 via that electrically conductive layer, the through holes 600 and 601 may instead be configured in such a manner that the entire through holes 600 and 601 are filled with an electrical conductor, for example. Alternatively, the through holes 600 and 601 may be configured in such a manner that a metallic rod (e.g. a through hole pin, or the like) is passed into the through holes 600 and 601, and is soldered to the wiring patterns on the respective front and back surfaces of the substrates 510 and 520.

An improvement in the transmission loss resulting from providing the through holes 600 and 601 will be described below. Here, the distance between the first ground plate 41 and the first central conductor 51, the distance between the first central conductor 51 and the second ground plate 42, the distance between the second ground plate 42 and the second central conductor 52, and the distance between the second central conductor 52 and the third ground plate 43 are set at 2.1 mm. In addition, the thicknesses of the first, second, and third ground plates 41, 42, and 43 are set at 1 mm, the electrical conductivities of the first, second, and third ground plates 41, 42, and 43 are set at $2.09 \times 10^7$ S/m, the thicknesses of the substrates 510 and 520 are set at 0.8 mm, the relative permittivities of the substrates 510 and 520 are set at 4.4, and the wiring patterns formed on the respective front and back surfaces of the substrates 510 and 520 are each made of a 0.035 mm thick copper foil. Also, the distance from the center in plan view of the metallic spacers 50 to the center in plan view of the first through holes 600 is set at 8 mm.

Figure 12:
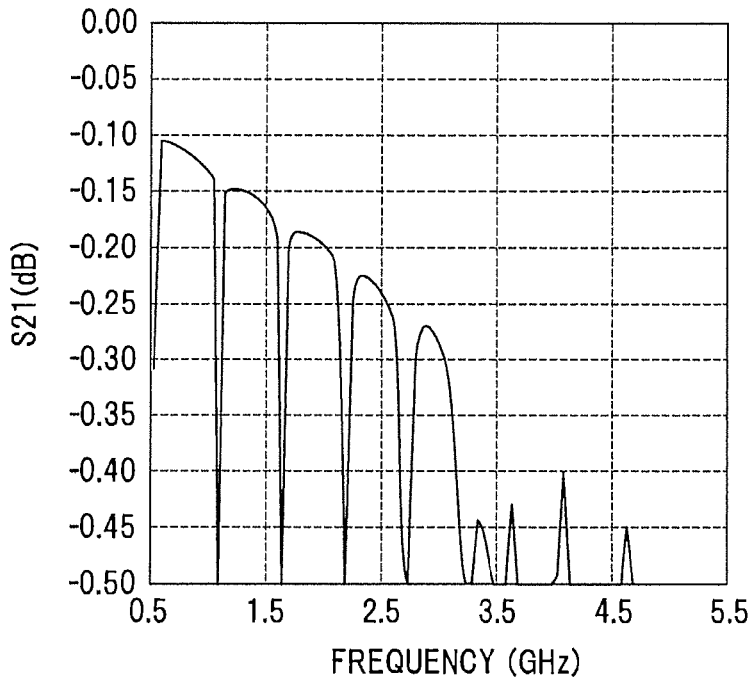
FIG. 12 is a graph showing a frequency property of $S_{21}$ when no through hole is formed.
Figure 13:
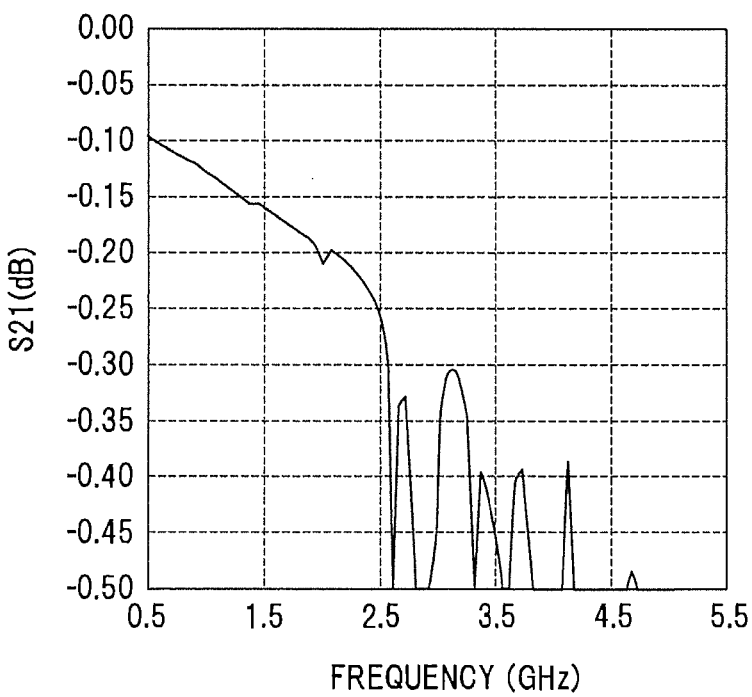
FIG. 13 is a graph showing a frequency property of $S_{21}$ when only a first through hole is provided.
Figure 14:
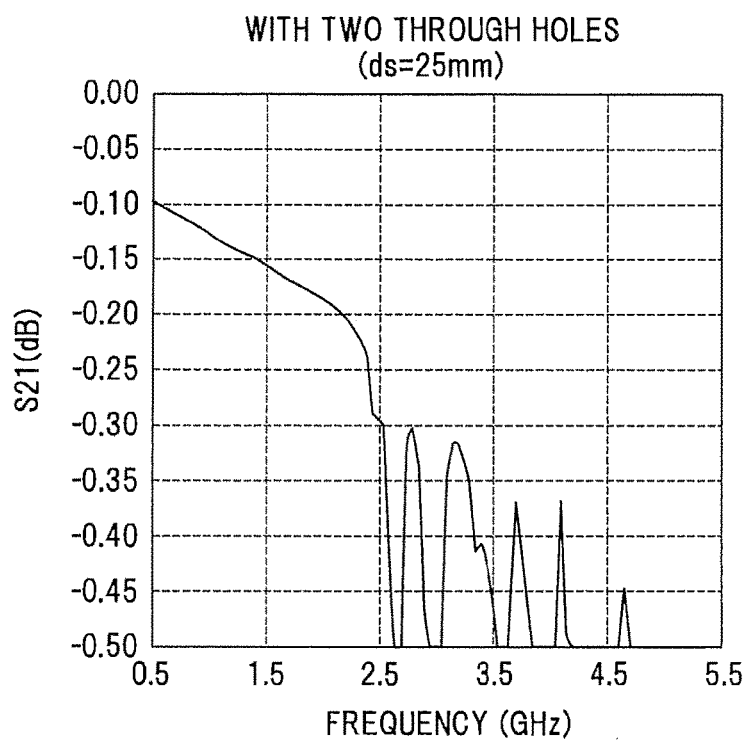
FIG. 14 is a graph showing a frequency property of $S_{21}$ when the first through hole and one second through hole are provided at a pitch of 25 mm.

FIG. 12 is a graph showing a frequency property of the $S_{21}$ when no through holes 600 and 601 were formed. FIG. 13 is a graph showing a frequency property of the $S_{21}$ when only one first through hole 600 was provided. FIG. 14 is a graph showing a frequency property of the $S_{21}$ when one first through hole 600 and one second through hole 601 were provided.

As shown in FIG. 12, when no through holes 600 and 601 were formed, the S-parameter $S_{21}$ describing a pass property formed the plurality of peaks, which decreased greatly in the particular frequency band. In the example of FIG. 12, the peaks occurred even in the band of 2 GHz, which was used for the mobile phone base station antenna. Therefore, improvement was desired.

In contrast, as shown in FIG. 13, when the one first through hole 600 was provided, the number of peaks of the $S_{21}$ decreased substantially in comparison with FIG. 12. It was therefore seen that the improvement in the transmission loss was ensured. In FIG. 13, the small peak occurred at the frequency of 2 GHz, but, by further forming the one second through hole 601, that small peak was also able to be removed, as shown in FIG. 14. Note that, herein, the through hole pitch ds was set at 25 mm.

Figure 15:
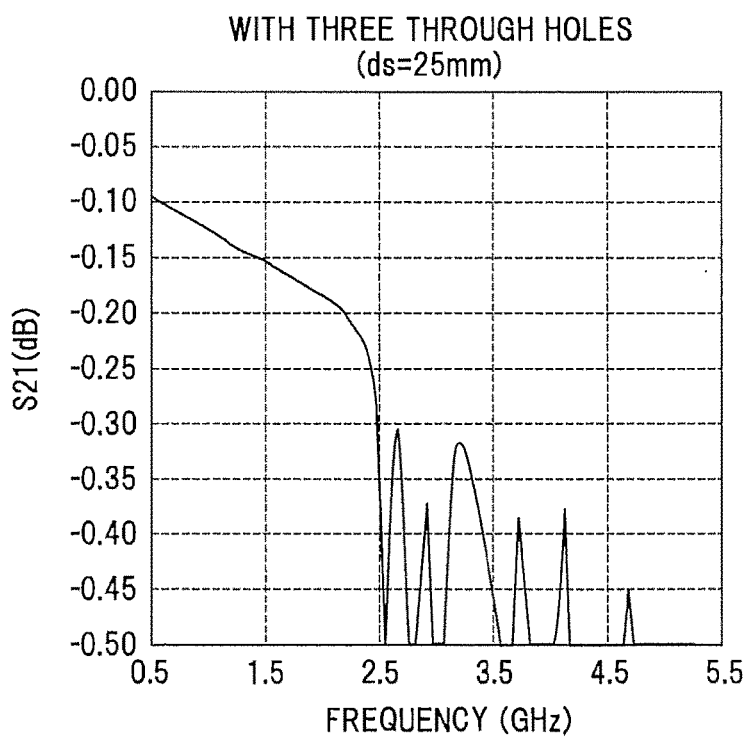
FIG. 15 is a graph showing a frequency property of $S_{21}$ when the first through hole and the two second through holes are provided at a pitch of 25 mm.
Figure 16:
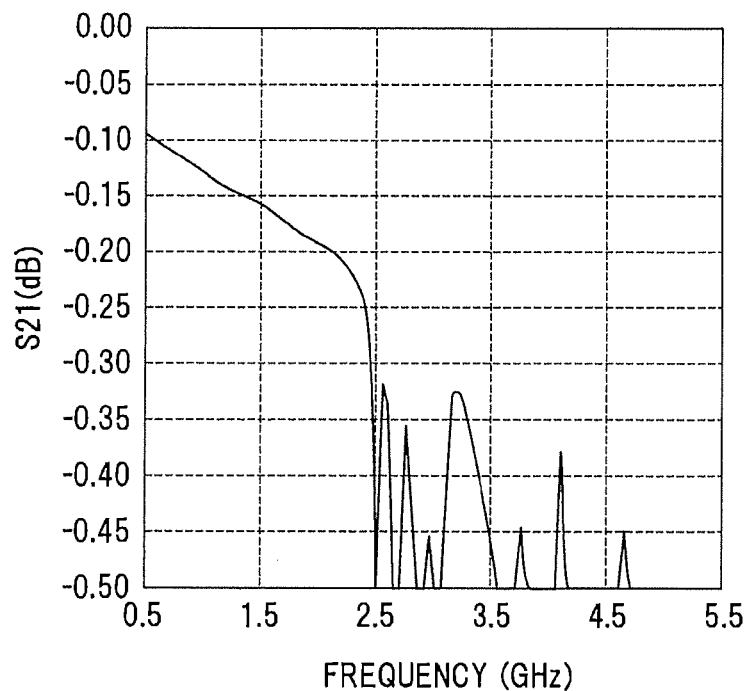
FIG. 16 is a graph showing a frequency property of $S_{21}$ when the first through hole and the three second through holes are provided at a pitch of 25 mm.
Figure 17:
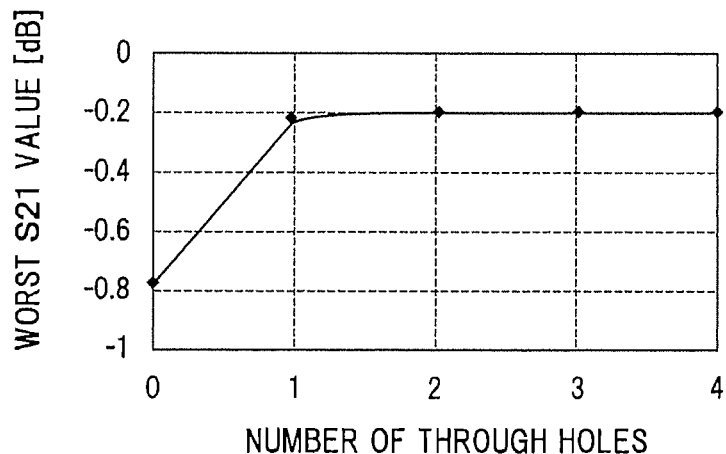
FIG. 17 is a graph showing a relationship between number of through holes and worst value of $S_{21}$.

Furthermore, FIG. 15 is a graph showing a frequency property of the $S_{21}$ when one first through hole 600 and two second through holes 601 (i.e. total three through holes) were provided at a pitch of 25 mm. FIG. 16 is a graph showing a frequency property of the $S_{21}$ when one first through hole 600 and three second through holes 601 (i.e. total four through holes) were provided at a pitch of 25 mm. Further, FIG. 17 is a graph showing together the worst values of the $S_{21}$ in the frequency range of 0.5 to 2.2 GHz, in FIGS. 14 to 16. Note that the horizontal axis of FIG. 17 represents the total number of the first and second through holes 600 and 601.

As shown in FIG. 17, the larger the number of second through holes 601 (the total number of through holes), the more improvement in the worst value of the $S_{21}$, thereby making it possible to reduce the occurrence of the peaks in the low frequency band. Also, from FIG. 17, it was seen that providing one or more second through holes 601 (total two or more through holes) made it possible to sufficiently improve the transmission loss.

Next, the through hole pitch ds will be examined.

Figure 18:
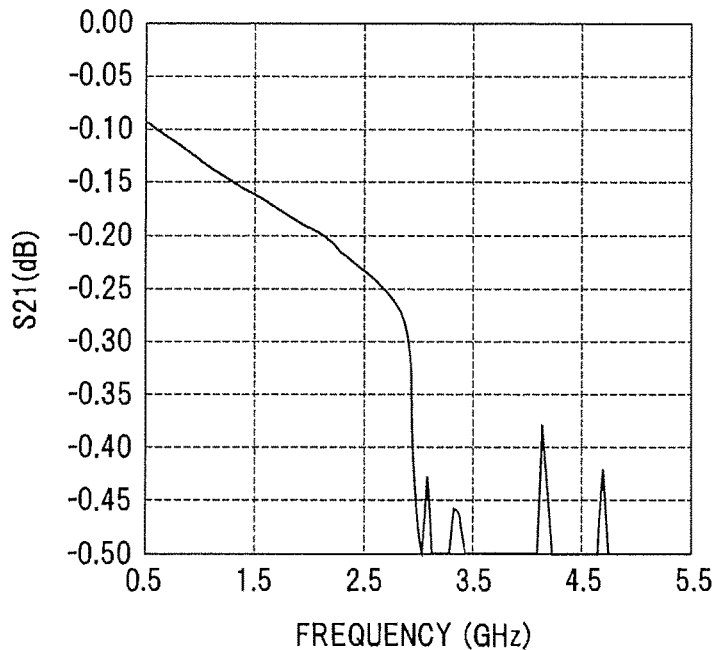
FIG. 18 is a graph showing a frequency property of $S_{21}$ when the first through hole and the one second through hole are provided at a pitch of 20 mm.
Figure 19:
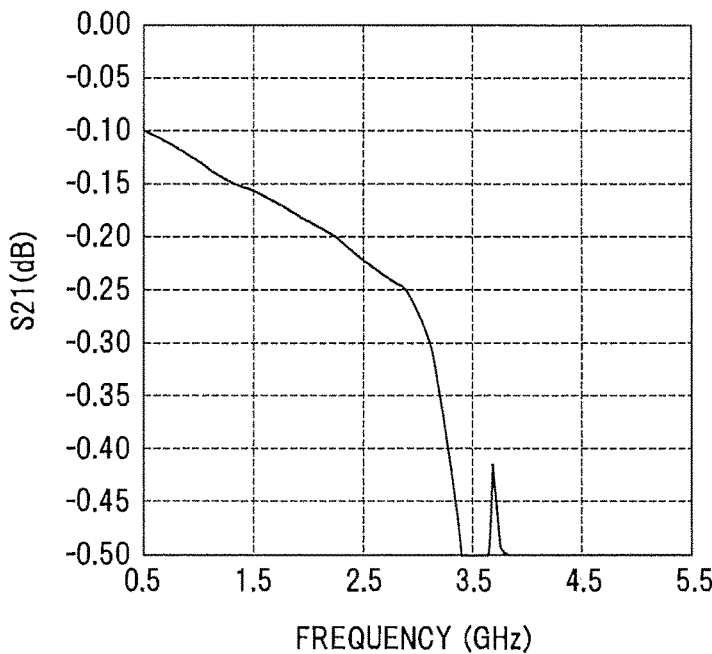
FIG. 19 is a graph showing a frequency property of $S_{21}$ when the first through hole and the one second through hole are provided at a pitch of 15 mm.

FIG. 18 is a graph showing a frequency property of the $S_{21}$ when one first through hole 600 and one second through hole 601 (i.e. total two through holes) were provided at a through hole pitch ds of 20 mm. FIG. 19 is a graph showing a frequency property of the $S_{21}$ when one first through hole 600 and one second through hole 601 (i.e. total two through holes) were provided at a through hole pitch ds of 15 mm. Also, FIG. 20 is a graph showing together the $S_{21}$ peak occurrence frequencies (i.e. the lowest frequencies at which the first peak occurred) in FIGS. 15, 18, and 19.

Figure 20:
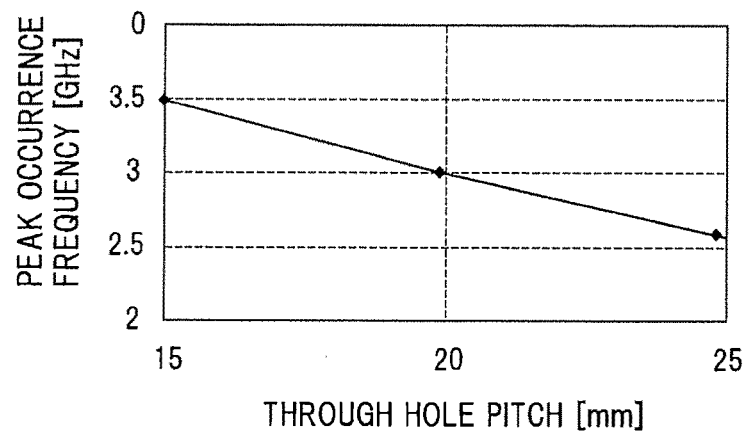
FIG. 20 is a graph showing a relationship between through hole pitch and $S_{21}$ peak occurrence frequency.

As shown in FIG. 20, it was seen that the shorter the through hole pitch ds, the higher the peak occurrence frequency. For example, when using the 2 GHz band, it is desirable to set the peak occurrence frequency at not lower than 2.5 GHz, and in this case, it is desirable to set the through hole pitch ds at not longer than 25 mm. In other words, setting the through hole pitch ds at not longer than 25 mm allows the peak occurrence frequency to be set at not lower than 2.5 GHz, thereby making it possible to reduce the transmission loss in 2 GHz band communication generally used for the mobile phone base station antenna. Incidentally, the through hole pitch ds may appropriately be set in accordance with a frequency band to be used.

Figure 21:
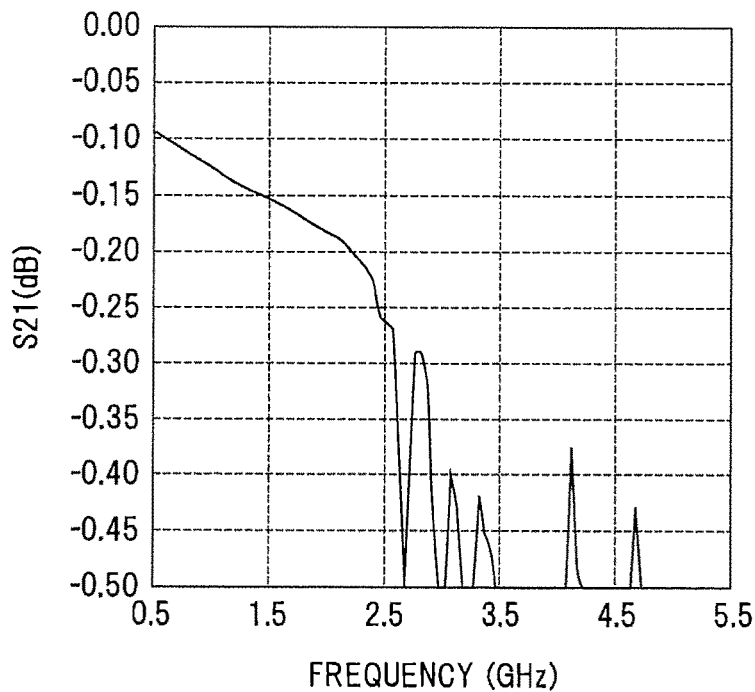
FIG. 21 is a graph showing a frequency property of $S_{21}$ when the first through hole and the one second through hole are provided for both the first and second central conductors, and when the through hole pitch in the first central conductor is set at 20 mm, while the through hole pitch in the second central conductor is set at 25 mm.

In addition, FIG. 21 is a graph showing a frequency property of the $S_{21}$ when one first through hole 600 and one second through hole 601 (i.e. total two through holes) were formed for both the first and second central conductors 51 and 52, and when the through hole pitch ds in the first central conductor 51 was set at 20 mm, while the through hole pitch ds in the second central conductor 52 was set at 25 mm.

As shown in FIG. 21, the transmission loss was able to be improved, even when the through hole pitches ds of both the central conductors 51 and 52 were made different.

Although herein has been described the structure in which the first through holes 600 are provided adjacent to the connecting portion 3 (the connecting pin 30) for the central conductors 51 and 52, a structure similar thereto can be applied to connecting portions for the antenna elements 15 and the central conductors 51 and 52 as well, thereby allowing for a further improvement in the transmission loss.

Figure 22:
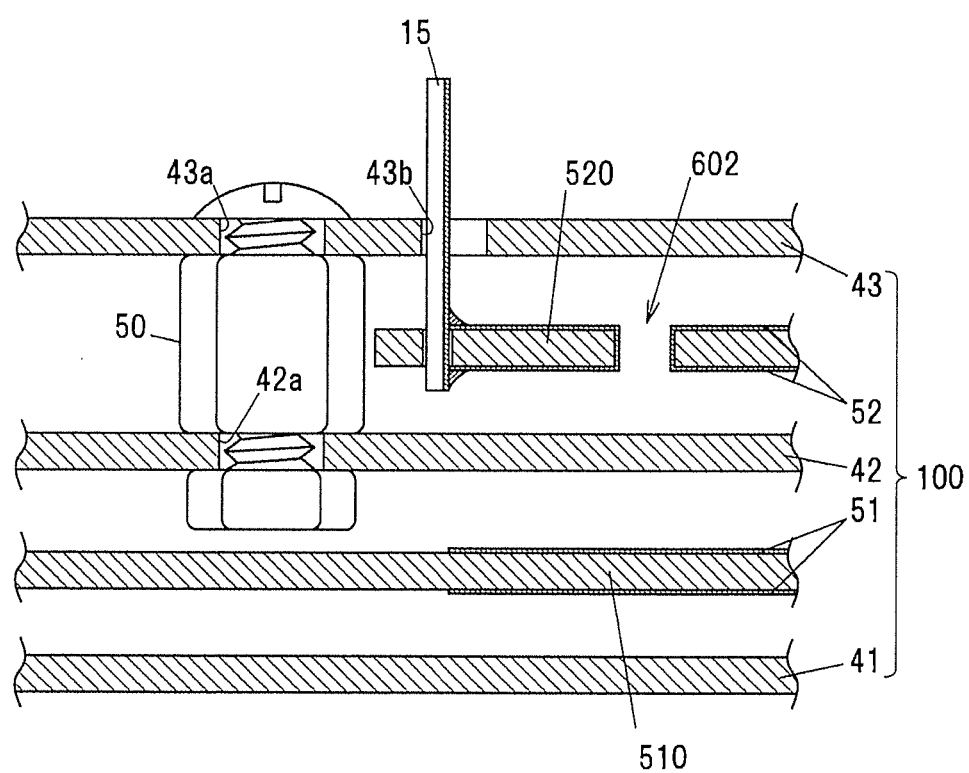
FIG. 22 is a schematic view showing a connecting structure between the antenna elements and the second central conductor.

As shown in FIG. 22, the antenna element 15 is inserted in an opening 43b, which is formed through the third ground plate 43, so as to be electrically connected to the second central conductor 52. The metallic spacer 50 to be configured as an electrically grounded conductor is disposed adjacent to a connecting portion for the antenna element 15 and the second central conductor 52.

In this embodiment, the second central conductor 52 is provided with a third through hole 602 adjacent to the connecting portion for the antenna element 15 and the second central conductor 52, thereby electrically connects together the wiring patterns on both the surfaces of the substrate 520. Providing the third through hole 602 allows for reducing the influence of the current path length difference in the connecting portion for the antenna element 15 and the second central conductor 52, i.e., the influence of the path length difference between the current paths in the wiring patterns on the front and back surfaces of the substrate 520, thereby making it possible to further improve the transmission loss.

Furthermore, although not shown, by applying a similar structure to a connecting portion for a feeding cable and the first central conductor 51, it is possible to further improve the transmission loss.

Because the feeding cable is electrically connected to the first central conductor 51 by insertion in an opening, which is formed through the first ground plate 41, a metallic spacer 50 may be arranged adjacent to the connecting portion for that feeding cable and the first central conductor 51, and the first central conductor 51 may be provided with a fourth through hole adjacent to that connecting portion, thereby electrically connects together the wiring patterns on both the surfaces of the substrate 510. Providing the fourth through hole allows for a further improvement in the transmission loss.

Figure 23:
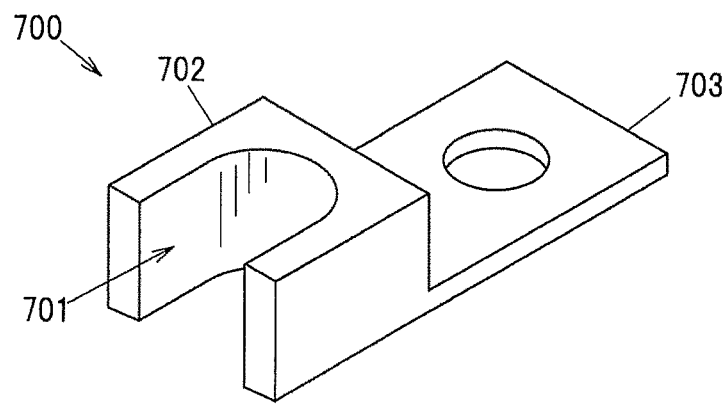
FIG. 23 is a perspective view showing a modification to the metallic spacer.
Figure 24:
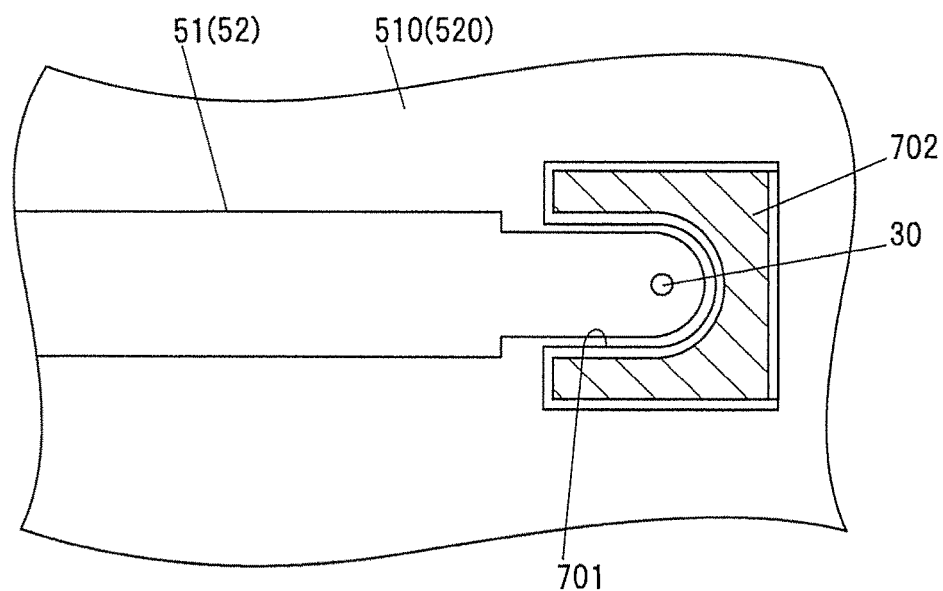
FIG. 24 is an explanatory diagram showing an example of use of the metallic spacer of FIG. 23.

Note that although in the present embodiment it has been described that the metallic spacers 50 having the hexagonal prism shaped shaft 501 are used, the shape of the metallic spacers 50 is not limited thereto. For example, as shown in FIGS. 23 and 24, there may be used a metallic spacer 700, which integrally includes a body 702 formed with a notch 701 for receiving ends of the first and second central conductors 51 and 52, and a plate washer 703 for being fixed to any of the first, second, and third ground plates 41, 42, and 43.

The metallic spacer 700 allows for suppressing current leak, thereby further improving the transmission loss, because the connecting pin 30 is disposed in the notch 701 in such a manner that a periphery of the connecting pin 30 (except in the direction of extending of the first central conductors 51 and 52) is covered with the body 702.

Operation and Effect of the Embodiment

With the above described embodiment, since the wiring patterns on the respective front and back surfaces of the substrates 510 and 520 are electrically connected together by the first through holes 600 adjacent to the connecting pin 30, it is possible to reduce the influence of the path length differences between the current paths in the wiring patterns on the front and back surfaces of the substrates 510 and 520, and thereby ensure a further improvement in the transmission loss.

Summary of the Embodiments

Next, the technical concept that is ascertained from the embodiments described above will be described with the aid of the reference characters and the like in the embodiments. It should be noted, however, that each of the reference characters in the following description should not be construed as limiting the constituent elements in the claims to the members and the like specifically shown in the embodiments.

[1] An antenna device (1), comprising: a transmission line (100) for propagating high frequency signal; and a plurality of antenna elements (15) connected to the transmission line (100), wherein the transmission line (100) includes: a first plate-shaped conductor, a second plate-shaped conductor, and a third plate-shaped conductor (41, 42, and 43) electrically grounded, the second plate-shaped conductor (42) including an inserting hole (42*b*) formed therethrough; a first central conductor (51) disposed between the first plate-shaped conductor (41) and the second plate-shaped conductor (42); a second central conductor (52) disposed between the second plate-shaped conductor (42) and the third plate-shaped conductor (43); an electrically connecting member (30) inserted in the inserting hole (42*b*) formed through the second plate-shaped conductor (42), and configured to electrically connect the first central conductor (51) and the second central conductor (52) together; and an electrically grounded conductor (50) disposed adjacent to the electrically connecting member (30), wherein the first central conductor (51) and the second central conductor (52) each includes a substrate (510, 520) made of a dielectric, and are each composed of respective wiring patterns provided on both surfaces, respectively, of the respective substrate (510, 520), wherein at least one of the first central conductor (51) and the second central conductor (52) is provided with a first through hole (600) formed adjacent to the electrically connecting member (30), thereby electrically connects together the wiring patterns on both the surfaces of the substrate (510, 520) of the at least one of the first central conductor (51) and the second central conductor (52).

[2] The antenna device (1) according to [1] above, wherein the first through hole (600) is provided for both the first central conductor (51) and the second central conductor (52).

[3] The antenna device (1) according to [1] or [2] above, wherein the at least one of the first central conductor (51) and the second central conductor (52) is provided with one or more second through holes (601) located on an opposite side of the first through hole (600) to the electrically connecting member (30) and spaced apart from the first through hole (600), thereby electrically connects together the wiring patterns on both the surfaces of the substrate (510, 520) of the at least one of the first central conductor (51) and the second central conductor (52).

[4] The antenna device (1) according to [3] above, wherein the first through hole (600) and the second through holes (601) are provided at an equal through hole pitch of not longer than 25 mm in a longitudinal direction of the wiring patterns.

[5] The antenna device (1) according to any one of [1] to [4] above, wherein the third plate-shaped conductor (43) includes openings (43*b*) formed therethrough, so that the antenna elements (15) are inserted in those openings (43*b*) respectively formed through the third plate-shaped conductor (43) and are electrically connected to the second central conductor (52), wherein the grounded conductor (50) is disposed adjacent to connecting portions for the antenna elements (15) and the second central conductor (52), wherein the second central conductor (52) is provided with a third through hole (602) adjacent to the connecting portions for the antenna elements (15) and the second central conductor (52), thereby electrically connects together the wiring patterns on both the surfaces of the substrate (520) of the second central conductor (52).

[6] The antenna device (1) according to any one of [1] to [5] above, wherein the first plate-shaped conductor (41) includes an opening formed therethrough, and is provided with a feeding cable to be inserted in that opening formed through the first plate-shaped conductor (41) and be electrically connected to the first central conductor (51), wherein the grounded conductor (50) is disposed adjacent to a connecting portion for the feeding cable and the first central conductor (51), wherein the first central conductor (51) is provided with a fourth through hole adjacent to the connecting portion for the feeding cable and the first central conductor (51), thereby electrically connects together the wiring patterns on both the surfaces of the substrate (510) of the first central conductor (51).

Although the embodiments of the present invention has been described above, the embodiments described above should not be construed as limiting the invention in the appended claims. It should also be noted that not all the combinations of the features described in the above embodiments are essential to the means for solving the problems of the invention.

The present invention may be appropriately modified and practiced without departing from the spirit and scope thereof. For example, in the above embodiments, the metallic spacer 50A and the metallic spacer 50B may be formed integrally with each other. That is, a metallic spacer made of a single conductor may be arranged between the first ground plate 41 and the third ground plate 43 in such a manner that it is disposed adjacent to the connecting pin 30.

In addition, the application of the antenna device is not limited to the use for the mobile phone base station.

Although the invention has been described with respect to the specific embodiments for complete and clear disclosure, the appended claims are not to be thus limited but are to be construed as embodying all modifications and alternative constructions that may occur to one skilled in the art which fairly fall within the basic teaching herein set forth.

What is claimed is:

1. An antenna device, comprising:
   a transmission line for propagating a high frequency signal; and
   a plurality of antenna elements connected to the transmission line,
   wherein the transmission line includes:
      a first plate-shaped conductor, a second plate-shaped conductor, and a third plate-shaped conductor which are electrically grounded, the second plate-shaped conductor including an inserting hole formed therethrough;
      a first central conductor disposed between the first plate-shaped conductor and the second plate-shaped conductor;

a second central conductor disposed between the second plate-shaped conductor and the third plate-shaped conductor;
an electrically connecting member inserted in the inserting hole formed through the second plate-shaped conductor, and configured to electrically connect the first central conductor and the second central conductor together; and
an electrically grounded conductor disposed adjacent to the electrically connecting member,
wherein the first central conductor includes a substrate comprising a dielectric material and comprises wiring patterns provided on both surfaces of the substrate of the first central conductor,
wherein the second central conductor includes a substrate comprising a dielectric material and comprises wiring patterns provided on both surfaces of the substrate of the second central conductor,
wherein at least one of the first central conductor or the second central conductor is provided with a first through hole formed adjacent to the electrically connecting member, thereby electrically connects together the wiring patterns on both the surfaces of the substrate of the at least one of the first central conductor or the second central conductor.

2. The antenna device according to claim 1, wherein the first through hole is provided for both the first central conductor and the second central conductor.

3. The antenna device according to claim 1, wherein the at least one of the first central conductor or the second central conductor is provided with one or more second through holes located on an opposite side of the first through hole to the electrically connecting member and spaced apart from the first through hole, thereby electrically connects together the wiring patterns on both the surfaces of the substrate of the at least one of the first central conductor or the second central conductor.

4. The antenna device according to claim 3, wherein the first through hole and the one or more second through holes are provided at an equal through hole pitch of not longer than 25 mm in a longitudinal direction of the wiring patterns.

5. The antenna device according to claim 1, wherein the third plate-shaped conductor includes openings formed therethrough, so that the antenna elements are inserted in the openings respectively formed through the third plate-shaped conductor and are electrically connected to the second central conductor,
wherein the electrically grounded conductor is disposed adjacent to connecting portions for the antenna elements and the second central conductor,
wherein the second central conductor is provided with a third through hole adjacent to the connecting portions for the antenna elements and the second central conductor, thereby electrically connects together the wiring patterns on both the surfaces of the substrate of the second central conductor.

6. The antenna device according to claim 1, wherein the first plate-shaped conductor includes an opening formed therethrough, and is provided with a feeding cable to be inserted in the opening formed through the first plate-shaped conductor and be electrically connected to the first central conductor,
wherein the electrically grounded conductor is disposed adjacent to a connecting portion for the feeding cable and the first central conductor,
wherein the first central conductor is provided with a fourth through hole adjacent to the connecting portion for the feeding cable and the first central conductor, thereby electrically connects together the wiring patterns on both the surfaces of the substrate of the first central conductor.

* * * * *